United States Patent [19]

Mizuochi

[11] Patent Number: 5,349,597
[45] Date of Patent: Sep. 20, 1994

[54] SEMICONDUCTOR LASER DEVICE AND PRODUCTION METHOD THEREFOR

[75] Inventor: Hitoshi Mizuochi, Itami, Japan

[73] Assignee: Mitsubishi Denki Kabushiki Kaisha, Tokyo, Japan

[21] Appl. No.: 106,605

[22] Filed: Aug. 16, 1993

[30] Foreign Application Priority Data

Aug. 25, 1992 [JP] Japan .................. 4-250830

[51] Int. Cl.$^5$ ............................... H01S 3/19
[52] U.S. Cl. ................... 372/44; 372/47; 437/129
[58] Field of Search .................... 372/43-50; 437/81, 83, 84, 92, 94, 126, 129, 130

[56] References Cited

U.S. PATENT DOCUMENTS

| | | | |
|---|---|---|---|
| 3,900,863 | 8/1975 | Kim | 372/49 X |
| 4,213,808 | 7/1980 | Thompson et al. | 372/46 X |
| 4,331,938 | 5/1982 | Limm et al. | 372/50 |
| 4,523,212 | 6/1985 | Hawrylo | 372/45 X |
| 4,679,199 | 7/1987 | Olshansky | 372/44 |
| 4,788,688 | 11/1988 | Hasenberg et al. | 372/45 |
| 5,003,548 | 3/1991 | Bour et al. | 372/44 |
| 5,153,889 | 10/1992 | Sugawara et al. | 372/45 |

FOREIGN PATENT DOCUMENTS 4280447 10/1992 Japan .

OTHER PUBLICATIONS

Ng et al, "Effect of p–Doping on Carrier Lifetime and Threshold Current Density of 1.3 $\mu$m GaInAsP/InP Lasers by Liquid-Phase Epitaxy", Electronics Letters, vol. 16, No. 18, pp. 693–695, Aug. 1980.

Nakano et al, "1.3 $\mu$m Burried-Heterostructure Lasers on p-Type InP Substrates", IEEE Journal of quantum Electronics, vol. QE-21 No. 5, May 1985, pp. 452–457.

Hirano et al, "Electrical Characteristics of Zn in Heavily Doped InP Grown by the Liquid-Encapsulated Czochralski Technique", Journal of Applied Physics 71 (2), Jan. 1992, pp. 659–663.

Young et al, "On The 'Tunnel'Diffusion Of Iron Dopant In InP", Journal of Crystal Growth, vol. 107, 1991, pp. 274–278.

Takomoto et al, "1.3 $\mu$m InGaAsP/InP Distributed–Feedback P–subtrate partially Inverted Buried-Heterostructure Laser Diode", Electronics Letters, vol. 23, No. 11, May 1987, pp. 546–547.

Extended Abstracts of the 39th Spring Meeting, 1992, of the Japan Society of Applied Physics and Related Societies, No. 30a-ZB-6 "Impurity Interdiffusion between P-type and Fe-doped Layers in InP", Mar. 1992, Takeuchi et al.

*Primary Examiner*—John D. Lee
*Attorney, Agent, or Firm*—Leydig, Voit & Mayer

[57] ABSTRACT

A semiconductor laser device includes a Zn-doped p type semiconductor substrate in which more than 81% of Zn dopant atoms are activated to produce carriers, and semiconductor layers epitaxially grown on the Zn-doped p type semiconductor substrate, including an active layer sandwiched between n type and p type cladding layers. Therefore, during the epitaxial growth of the semiconductor layers, diffusion of inactive Zn atoms from the substrate to semiconductor layers is reduced, with the result that the internal loss due to free carrier absorption in the active layer and the underlying p type cladding layer is reduced and non-radiative recombinations of carriers in the active layer are reduced.

7 Claims, 4 Drawing Sheets

SEMICONDUCTOR LASER DEVICE AND PRODUCTION METHOD THEREFOR

FIELD OF THE INVENTION

The present invention relates to semiconductor laser devices fabricated by epitaxially growing semiconductor layers on a Zn-doped p type semiconductor substrate.

BACKGROUND OF THE INVENTION

FIG. 4 is a perspective view, partially broken away, illustrating a distributed feedback laser (hereinafter referred to as DFB laser) having a buried heterojunction structure (hereinafter referred to as BH structure), which is disclosed in, for example, ELECTRONICS LETTERS, 21 May 1987, Vol. 23, pp. 546–547 and ELECTRONICS LETTERS, 2 Feb. 1989, Vol. 25, No. 3, pp. 220–221. In the figure, reference numeral 1 designates a p type InP substrate containing Zn as a dopant. A double heterojunction structure including an InGaAsP active layer 2 sandwiched between a p type InP lower cladding layer 11 and an n type InP first upper cladding layer 12 is disposed on the InP substrate 1. An InGaAsP layer 13 having a diffraction grating structure 14 is disposed on the first upper cladding layer 12. An n type InP second upper cladding layer 15 is disposed on the diffraction grating structure 14. A first p type InP layer 3, an n type InP layer 4, and a second p type InP layer 5 are disposed on opposite sides of the active region, producing a p-n-p current blocking structure. An n type InP third upper cladding layer 6 is disposed on the n type InP second upper cladding layer 15 and the second p type InP layer 5. An n type InGaAsP contact layer 7 is disposed on the third upper cladding layer 6. An insulating film 8 is disposed on the n type InGaAsP contact layer 7 except for a region opposite the active region and extends onto the side surfaces of the laser structure. An n side electrode 9 is disposed on the n type InGaAsP contact layer 7 and the insulating film 8. A p side electrode 10 is disposed on the rear surface of the substrate 1.

A method for fabricating the DFB laser of FIG. 4 is illustrated in FIGS. 5(a)–5(f).

Initially, there are epitaxially grown on the Zn-doped p type InP substrate 1, the Zn-doped p type InP lower cladding layer 11 having a carrier concentration of $1 \times 10^{18}$ cm$^{-3}$ or more, the InGaAsP active layer 2, the n type InP first upper cladding layer 12, and the InGaAsP layer 13 (FIG. 5(a)).

After the epitaxial growth, the diffraction grating structure 14 is formed by a conventional technique (FIG. 5(b)). For example, using photolithography, a photoresist is deposited on the InGaAsP layer, exposed to interference fringes of light, and developed as a mask with a periodic structure. Then, the layer 13 is etched through the mask, and the mask is removed.

Thereafter, the n type InP second upper cladding layer 15 is epitaxially grown on the wafer, and a stripe-shaped dielectric film 20 is formed on the second upper cladding layer 15 (FIG. 5(c)).

Then, the wafer is etched using the dielectric film 20 as a mask to form the double heterojunction structure in a mesa shape (FIG. 5(d)).

Thereafter, the first p type InP current blocking layer 3, the n type InP current blocking layer 4, and the second p type InP current blocking layer 5 are successively grown on opposite sides of the stripe mesa by LPE (Liquid Phase Epitaxy) or the like, and the n type InP third upper cladding layer 6 and the n type InGaAsP contact layer 7 are successively grown on the surface of the wafer (FIG. 5(e)). Carrier concentrations of the p type InP current blocking layers 3 and 5 are in a range from $1 \times 10^{17}$ cm$^{-3}$ to $1 \times 10^{18}$ cm$^{-3}$ and are produced by doping those layers with Zn.

Then, the laser structure is formed in a mesa shape by etching (FIG. 5(f)). Then, an insulating film 8 is deposited on the entire surface and the side surfaces of the laser structure and a portion of the insulating film 8 opposite the active region is removed to expose the contact layer 7. Finally, the n side electrode 9 is formed in contact with the contact layer 7 and the p side electrode 10 is formed on the rear surface of the substrate 1, completing the DFB laser of FIG. 4.

In the DFB laser thus fabricated, reactive current flowing outside the InGaAsP active layer 2 is reduced by the p-n-p current blocking layers disposed on opposite sides of the active layer 2. In addition, since the carrier concentration of the first p type InP current blocking layer 3 ($1 \times 10^{17} \sim 1 \times 10^{18}$ cm$^{-3}$) is lower than the carrier concentration of the p type InP lower cladding layer 11 ($1 \times 10^{18}$ cm$^{-3}$ or more), the resistance of the current blocking layer 3 is higher than that of the lower cladding layer 11, whereby the reactive current during the laser operation is reduced.

In fabricating the DFB laser of FIG. 4 according to the process steps of FIGS. 5(a)–5(f), although the epitaxial growth of the semiconductor layers on the Zn-doped semiconductor substrate 1 is always carried out under the same conditions, if the Zn dopant concentration in the substrate 1 varies from substrate to substrate, between substrate lots, threshold current and efficiency of the completed laser unfavorably vary, resulting in difficulty in manufacturing high power output DFB lasers with high reproducibility.

Threshold current density Jth and external differential quantum efficiency $\gamma$ex of a semiconductor laser are represented by $$Jth = \frac{dAL}{\beta \Gamma v}\left(ai + \frac{\ln(1/R1 \cdot R2)}{2L}\right) + dAL J0 \quad (1)$$

$$\eta ex = \eta i \frac{\ln(1/R1 \cdot R2)}{2Lai + \ln(1/R1 \cdot R2)} \quad (2)$$

where dAL is the thickness of the active layer, $\Gamma$v is the light confinement coefficient, L is the resonator length, R1 and R2 are reflectances at the front facet and the rear facet, respectively, J0 is the current density when the gain is O, $\beta$ is the gain factor constant which is proportional to the lifetime of carrier, $\eta$i is the internal differential quantum efficiency, and $\alpha$i is the internal loss due to free carrier absorption in the crystalline layers on the substrate. In order to reduce the threshold current and increase the efficiency of the semiconductor laser, the internal loss $\alpha$i must be decreased, and the gain factor constant $\beta$ must be increased by reducing non-radiative recombinations of carriers in the active layer.

SUMMARY OF THE INVENTION

It is an object of the present invention to provide a high power output semiconductor laser with low threshold current and high efficiency, that reduces the internal loss $\alpha$i due to free carrier absorption in the epitaxial layers and increases the gain factor constant $\beta$ by reducing non-radiative recombinations of carriers in the active layer.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor laser includes a plurality of semiconductor layers epitaxially grown on a Zn-doped p type semiconductor substrate in which more than 81% of the Zn dopant atoms are activated to produce carriers. Therefore, diffusion of inactive Zn atoms from the substrate into the epitaxial layers during the growth process is suppressed, with the result that the internal loss due to free carrier absorption in an active layer and the underlying p type cladding layer is reduced and non-radiative recombinations of carriers in the active layer are reduced.

According to a second aspect of the present invention, a semiconductor laser device includes a double heterojunction structure including an active layer and p type and n type cladding layers, which are epitaxially grown on a p type semiconductor substrate. The p type cladding layer is grown while adding Zn as a dopant so that more than 81% of the Zn dopant atoms are activated to produce carriers. Therefore, diffusion of inactive Zn atoms from the p type cladding layer to the active layer during the epitaxial growth process is suppressed, with the result that internal loss due to free carrier absorption in the active layer and the p type cladding layer is reduced and non-radiative recombinations of carriers in the active layer are reduced.

According to a third aspect of the present invention, the epitaxially grown semiconductor layers are formed in a stripe shape mesa, and p-n-p current blocking layers are epitaxially grown on opposite sides of the mesa. During the epitaxial growth, Zn as a dopant is added to the p type current blocking layers so that more than 81% of the Zn dopant atoms are activated to produce carriers. Therefore, diffusion of inactive Zn atoms from the p type layers to the active layer and the cladding layer during the growth process is suppressed, with the result that the internal loss due to free carrier absorption in the active layer and the p type cladding layer is reduced and non-radiative recombinations of carriers in the active layer are reduced.

DETAILED DESCRIPTION OF THE PREFERRED EMBODIMENTS

Figure 1:
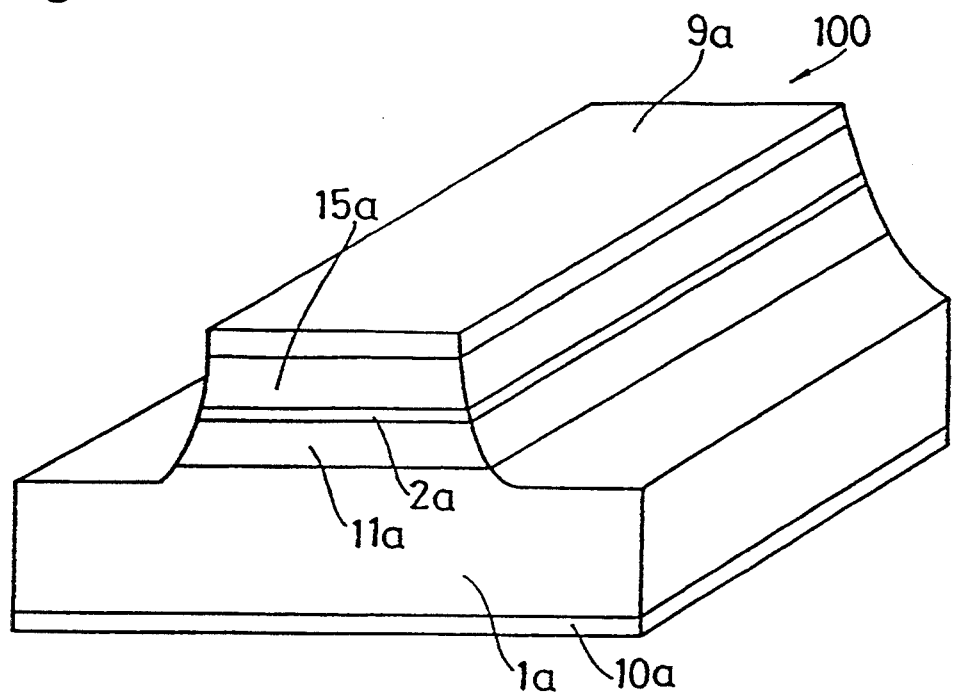
FIG. 1 is a perspective view of a broad area mesa type semiconductor laser device in accordance with an embodiment of the present invention.

FIG. 1 is a perspective view illustrating a broad area mesa type semiconductor laser in accordance with an embodiment of the present invention. In the figure, the broad area mesa type laser 100 includes a p type InP substrate 1a to which Zn as a dopant is added to a concentration of $5.3 \times 10^{18}/cm^3$. More than 81% of the Zn dopant atoms are activated. A p type InP lower cladding layer 11a about 2 microns thick, an InGaAsP active layer 2a about 0.1 micron thick, and an n type InP upper cladding layer 15a about 1 micron thick are successively disposed on the p type InP substrate 1a. An n side electrode 9a is disposed on the upper cladding layer 15a and a p side electrode 10a is disposed on the rear surface of the substrate 1a. Preferably, the resonator length is 600 microns, the width of the n side electrode 9 is 70 microns, and the composition of the InGaAsP active layer 2a is selected so that the energy band gap thereof corresponds to a wavelength of 1.48 microns.

A description is given of a method for fabricating the semiconductor laser of FIG. 1.

Figure 2:
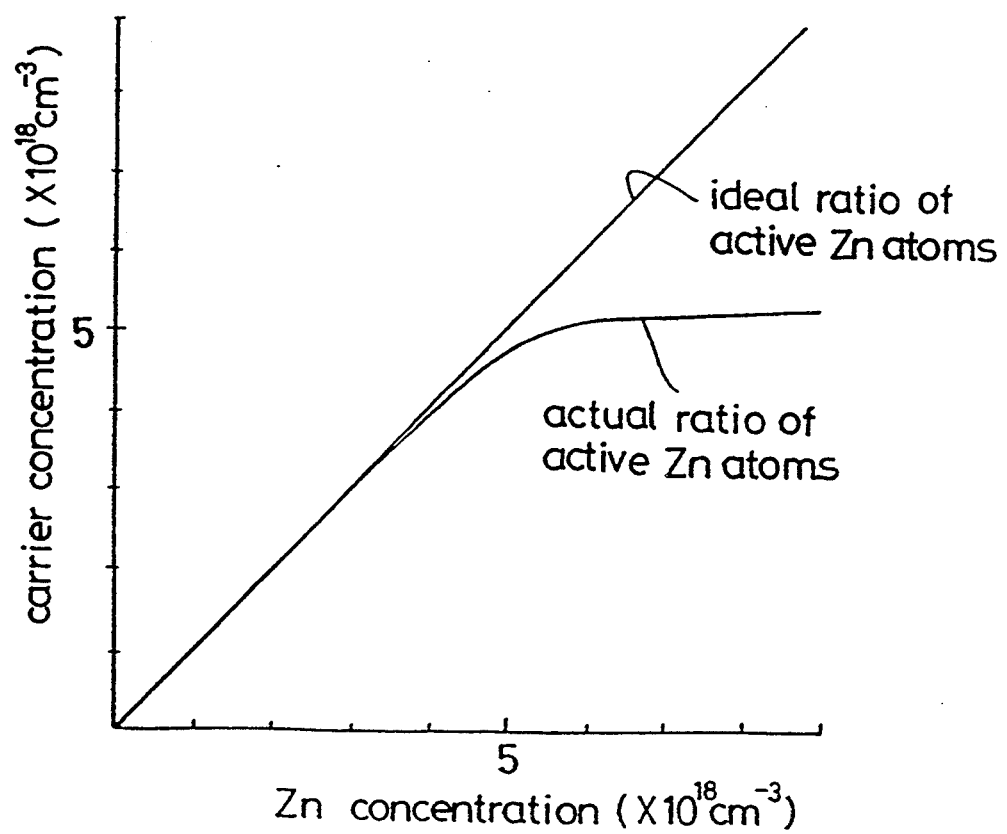
FIG. 2 is a graph illustrating relations between Zn dopant concentration and carrier concentration during production of a Zn-doped p type InP substrate by LEC (Liquid Encapsulated Czochralski) method.

First of all, the p type InP substrate 1a is formed by the liquid encapsulated Czochralski (LEC) method. FIG. 2 is a graph illustrating the relation between Zn dopant concentration and carrier concentration of a p type InP substrate, i.e., FIG. 2 shows the ratio of active Zn atoms to all Zn atoms in the substrate 1a. As shown in FIG. 2, an increase in the Zn dopant concentration increases the ratio of inactive Zn atoms to the Zn atoms added and decreases the ratio of active Zn atoms, i.e., carrier concentration/Zn dopant concentration. Doping with Zn atoms is usually performed to make a p type substrate and thereby reduce the resistance of the substrate. Therefore, it is necessary to add the Zn dopant so that the carrier concentration of the substrate produced is $3 \times 10^{18}/cm^3$ or more.

In the embodiment of the present invention, in order to significantly reduce the resistance of the substrate, the Zn-doped p type InP substrate is formed by the LEC method so that the carrier concentration is about $5 \times 10^{18}/cm^3$ and the ratio of active Zn atoms to all the Zn atoms exceeds 81%, according to the characteristic curve shown in FIG. 2. More specifically, Zn dopant is added in the substrate to a concentration of $5.3 \times 10^{18}/cm^3$ to form the Zn-doped p type InP substrate 1a having a carrier concentration of $5 \times 10^{18}/cm^3$ and a Zn atom activated rate of 94%.

Then, the p type InP lower cladding layer 11a, the InGaAsP active layer 2a, and the n type InP upper cladding layer 15a are successively grown on the Zn-doped p type InP substrate 1a. Preferably, these layers are grown by MOVPE (Metal Organic Vapor Phase Epitaxy) at a temperature of 650° C., a pressure of 150 Torr, a V/III ratio of 140, and a growth rate of 1 $\mu m/hr$. Then, a stripe-shaped dielectric film (not shown) is formed on a prescribed region of the n type InP upper cladding layer 15a, and etching is carried out using the dielectric film as a mask to form the epitaxially grown layers into a stripe shape mesa. After the dielectric film is removed, the p side electrode 10a is formed on the rear surface of the p type InP substrate 1a and the n side electrode 9a is formed on the n type InP upper cladding layer 15a, completing the structure of FIG. 1.

A description is given of the operation.

Figure 3:
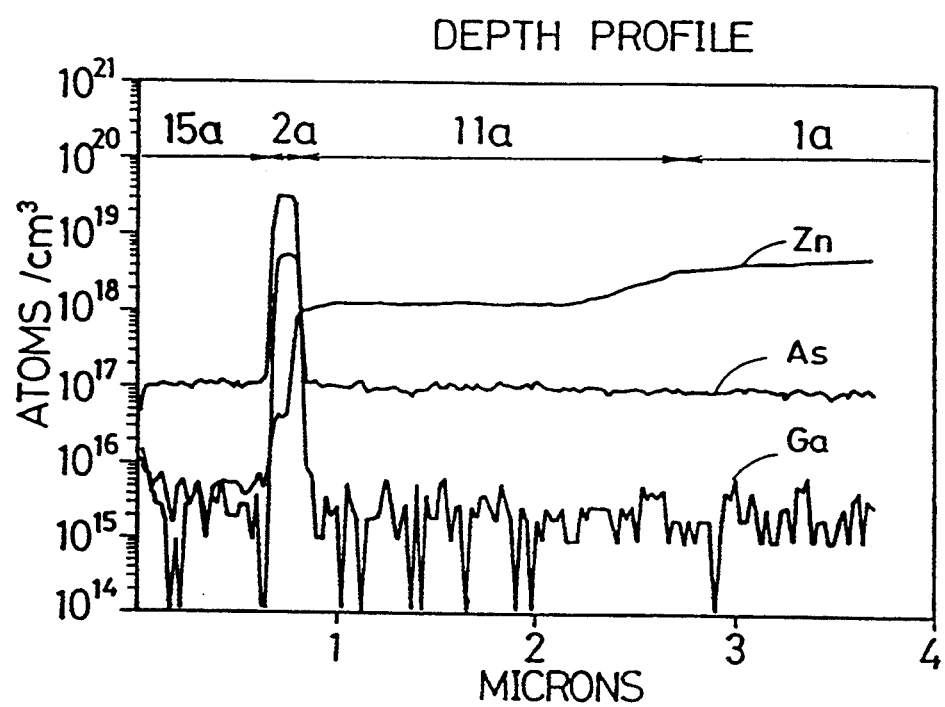
FIG. 3(a) is a diagram illustrating Zn, As, and Ga SIMS (Secondary Ion Mass Spectroscopy) profiles of the broad area mesa type semiconductor laser of FIG. 1.
FIG. 3(b) is a diagram illustrating Zn, As, and Ga SIMS profiles of a semiconductor laser employing a Zn-doped p type InP substrate in which less than 81% of the Zn dopant atoms are activated.
Figure 3:
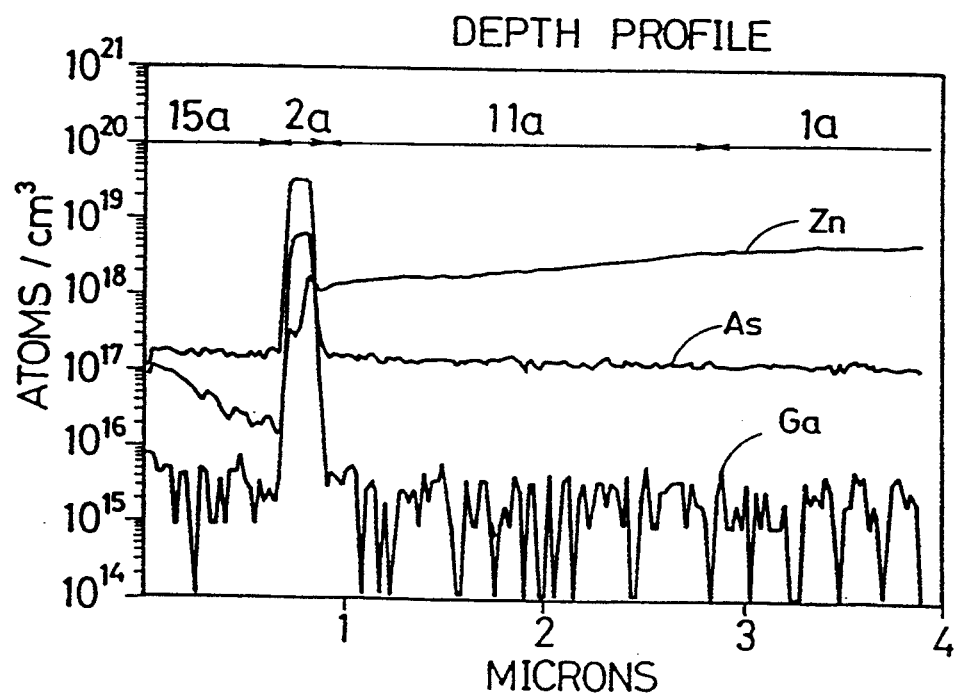

FIG. 3(a) shows a Zn SIMS profile as a function of depth of the semiconductor laser of FIG. 1, and FIG. 3(b) shows a Zn SIMS profile as a function of depth of a semiconductor laser employing a Zn-doped p type InP substrate which is formed by adding Zn as a dopant in a concentration of $6.3 \times 10^{18}/cm^3$ and activating 80% of the Zn atoms to provide a carrier concentration of $5 \times 10^{18}/cm^3$. In both figures As and Ga SIMS profiles are shown as references.

In the Zn depth profile of FIG. 3(a) according to the present invention, an interface between the p type InP substrate 1a and the p type InP cladding layer 11a is identified by a steep slope and its location is clear, but the location of that interface is not so clear in the Zn depth profile of FIG. 3(b). The reason is as follows. In the semiconductor laser of FIG. 3(b) using the Zn-doped p type InP substrate with the Zn atom activated ratio of below 81%, inactive Zn atoms in the substrate diffuse into the p type InP layer 11a, the InGaAsP layer 2a, and the n type InP layer 15a during the epitaxial growth process, resulting in an increase in the internal loss $\alpha i$ due to the free carrier absorption in the epitaxially grown layers and an increase in non-radiative recombinations in the active layer.

These two semiconductor lasers are operated by pulses with a pulse width of 0.1 μs and a duty ratio of 1/1000 to calibrate the threshold current, i.e., threshold current density Jth. While the threshold current density Jth of the semiconductor laser shown in FIG. 1 employing the Zn-doped p type InP substrate 1a with the Zn atom activated ratio of 94% is 1.6 KA/cm², the threshold current density Jth of the semiconductor laser for comparison employing the Zn-doped p type InP substrate with the Zn atom activated ratio of 80% is larger than 2.4 KA/cm² and, in this case, the laser would not oscillate at the maxium driving current (1 Amax) of the pulse generator.

According to the present invention, since the rate of active Zn atoms to all the Zn atoms in the Zn-doped p type InP substrate 1a is as high as 94%, diffusion of inactive Zn atoms from the substrate into the epitaxially grown layers on the substrate is reduced, whereby the internal loss $\alpha i$ due to free carrier absorption in the epitaxially grown layers is reduced and non-radiative recombinations in the active layer are reduced to increase the gain factor constant $\beta$, resulting in a low-threshold and high-efficiency semiconductor laser.

During epitaxially growth of the p type InP layer 11a, the InGaAsP layer 2a, and the n type InP layer 15a, if the p type InP cladding layer 11a is grown by adding Zn as a dopant according to the characteristic curve shown in FIG. 2 so that more than 81% of the Zn dopant atoms are activated, the amount of inactive Zn atoms diffused into the active layer is further reduced, resulting in a further reduction in the non-radiative recombinations in the active layer.

In the above-described embodiment, the ideal characteristic curve of the relation between carrier concentration and Zn dopant concentration in the formation of the Zn-doped p type InP substrate by the LEC method is previously provided. The substrate is formed by the LEC method, adjusting the Zn dopant concentration according to the ideal characteristic curve to achieve a desired carrier concentration. In this method, however, the quantity of Zn dopant atoms added to the substrate unfavorably varies between lots of substrates, process sequences and conditions, or the like. Therefore, before the epitaxial growth of layers on the Zn-doped p type InP substrate, the carrier concentration of the substrate is measured in a C-V profile measurement or a Hall effect measurement and the Zn dopant concentration is measured by the ICP method (inductive coupling high-frequency Ar gas plasma emission analysis) to find the ratio of active Zn atoms to all the Zn atoms in the substrate. Then, a substrate with a Zn atom activated ratio of 81% or more is selected and the laser structure is fabricated on the substrate, whereby the production yield is improved.

Figure 4:
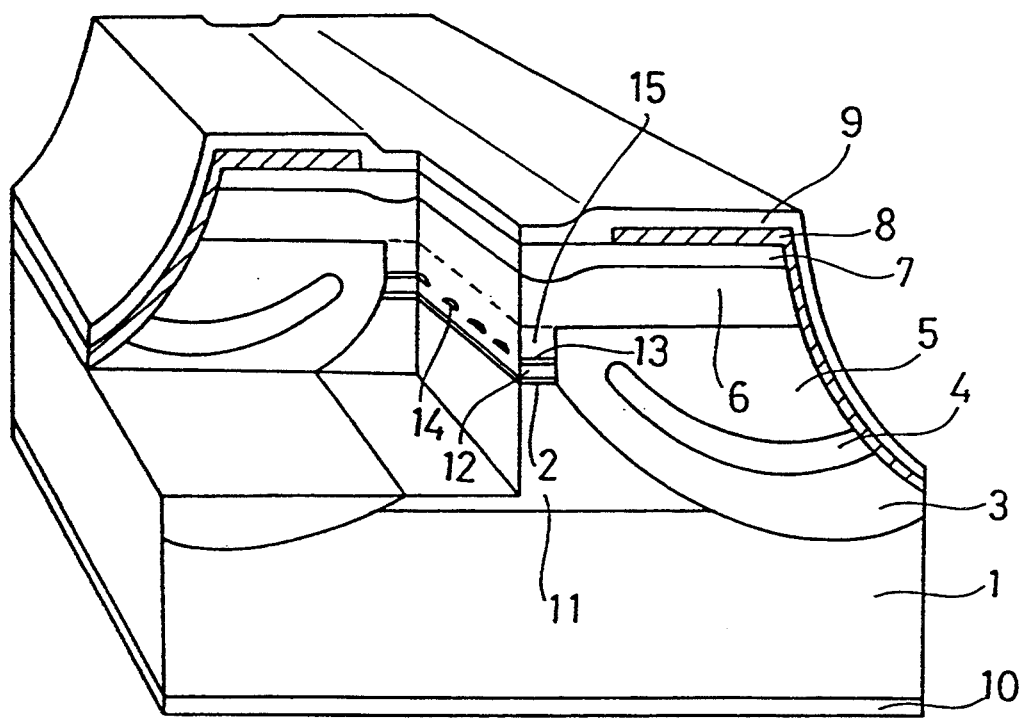
FIG. 4 is a perspective view illustrating a DFB semiconductor laser with a BH structure in accordance with the prior art.
Figure 5:
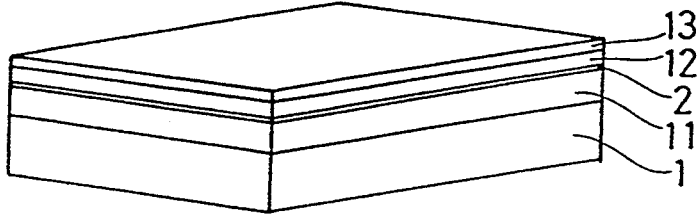
FIGS. 5(a)-5(f) are perspective views of steps in a method for producing the semiconductor laser of FIG. 4.
Figure 5:
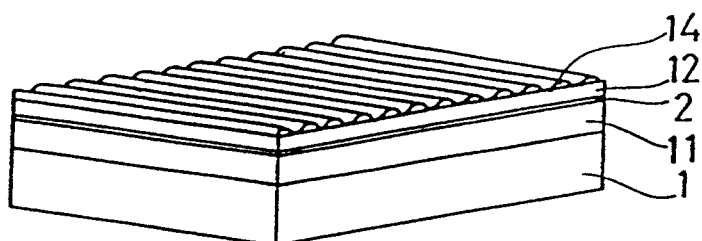
Figure 5:
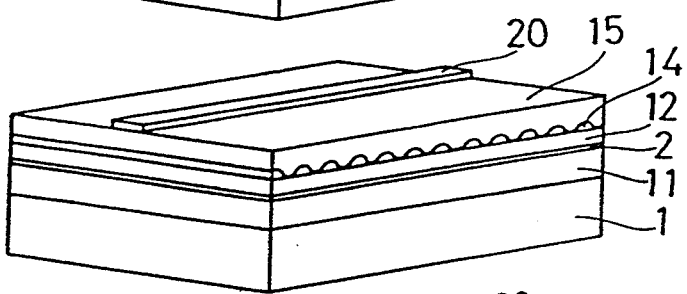
Figure 5:
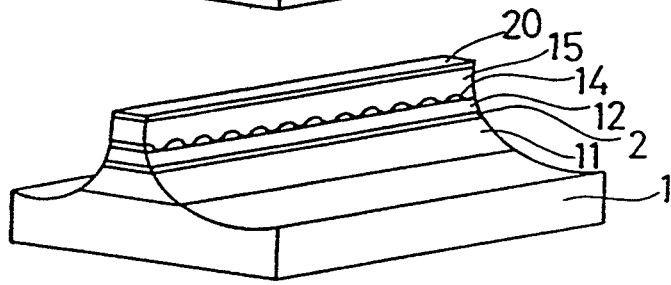
Figure 5:
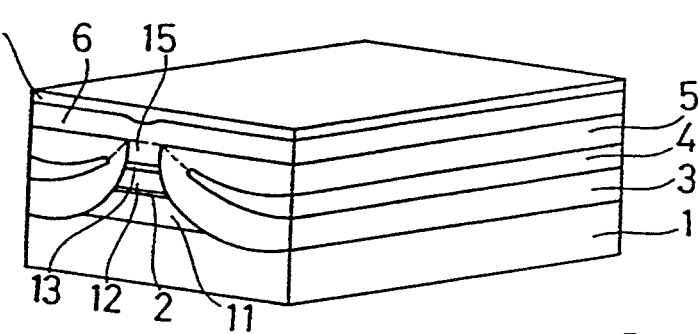
Figure 5:
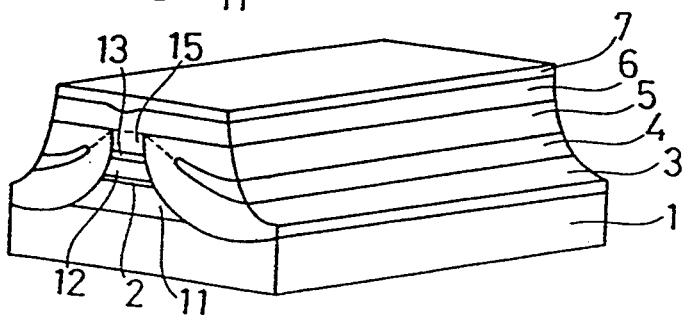

While in the above-described embodiment a broad area mesa type laser is employed, the present invention may be applied to a semiconductor laser having the BH structure shown in FIG. 4. In this case, when the p-n-p current blocking layers are epitaxially grown on opposite sides of the stripe mesa structure including the active layer, if the ratio of active Zn atoms to all the Zn atoms in the p type current blocking layers is 81% or more, the diffusion of inactive Zn atoms from the current blocking layers into the stripe mesa is reduced, whereby the internal loss $\alpha i$ due to free carrier absorption in the stripe mesa and non-radiative recombinations in the active layer are further reduced.

What is claimed is:

1. A semiconductor laser device comprising:
   a Zn-doped p type semiconductor substrate in which more than 81% of Zn dopant atoms are activated to produce carriers;
   semiconductor layers successively disposed on said Zn-doped p type semiconductor substrate including an active layer sandwiched between two cladding layers; and
   p side and n side electrodes electrically contacting said substrate and said semiconductor layers opposite said semiconductor substrate, respectively.

2. The semiconductor laser device of claim 1 wherein said p type semiconductor substrate and said cladding layers comprise InP and said active layer comprises InGaAsP.

3. The semiconductor laser device of claim 1 including:
   a stripe shape mesa including said semiconductor layers; and
   p-n-p current blocking structure disposed at opposite sides of said stripe mesa, including Zn-doped p type layers in which more than 81% of Zn dopant atoms are activated to produce carriers.

4. A method for producing a semiconductor laser device comprising:
   epitaxially growing semiconductor layers including an active layer on a Zn-doped p type semiconductor substrate in which more than 81% of Zn dopant atoms are activated to produce carriers; and
   forming p side and n side electrodes on the rear surface of said substrate and said semiconductor layers opposite said semiconductor substrate, respectively.

5. A method for producing a semiconductor laser device comprising:
   forming a Zn-doped p type InP substrate containing Zn atoms in a concentration less than $6.3 \times 10^{18}/cm^3$ by the Liquid Encapsulated Czochralski method, said substrate having a carrier concentration of $3 \times 10^{18}/cm^3$;

epitaxially growing a p type InP cladding layer, an InGaAsP active layer, and an n type InP cladding layer on said Zn-doped p type InP substrate; and forming p side and n side electrodes electrically contacting said substrate and said n type InP cladding layer, respectively.

6. The method of claim 5 including adding Zn as a dopant while growing said p type cladding layer so that more than 81% of said Zn dopant atoms are activated to produce carriers.

7. The method of claim 5 including:

forming said epitaxially grown layers into a stripe shape mesa; and epitaxially growing a p-n-p current blocking structure at opposite sides of said mesa so that Zn dopant atoms are added to the p type layers of said current blocking structure and more than 81% of said Zn dopant atoms are activated to produce carriers.

* * * * *